United States Patent
Mao et al.

(10) Patent No.: US 10,990,142 B2
(45) Date of Patent: Apr. 27, 2021

(54) UNLOCKING STRUCTURE AND ELECTRONIC DEVICE

(71) Applicant: Wistron Corporation, New Taipei (TW)

(72) Inventors: Zhong-Hui Mao, New Taipei (TW); Chia-Hsin Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 62 days.

(21) Appl. No.: 16/512,402

(22) Filed: Jul. 16, 2019

(65) Prior Publication Data

US 2020/0310500 A1   Oct. 1, 2020

(30) Foreign Application Priority Data

Mar. 27, 2019   (CN) .......................... 201910237665.7

(51) Int. Cl.
   *G06F 1/18*   (2006.01)
   *H05K 7/14*   (2006.01)

(52) U.S. Cl.
   CPC .............. *G06F 1/185* (2013.01); *G06F 1/184* (2013.01); *G06F 1/186* (2013.01); *H05K 7/1408* (2013.01)

(58) Field of Classification Search
   CPC ........... G06F 1/184; G06F 1/185; G06F 1/186
   See application file for complete search history.

(56) References Cited

U.S. PATENT DOCUMENTS

| 5,957,708 A * | 9/1999 | Lin .................... H01R 12/7005 439/157 |
| 7,233,500 B2 * | 6/2007 | Yu ....................... H05K 7/1409 361/679.32 |
| 8,092,239 B2 * | 1/2012 | Nishiyama ......... H01R 12/7005 439/157 |
| 9,519,317 B2 | 12/2016 | Hou et al. |
| 2005/0265007 A1 * | 12/2005 | Gordon ................ H05K 7/1409 361/755 |
| 2012/0134088 A1 * | 5/2012 | Li ......................... H05K 7/1408 361/679.4 |
| 2015/0048727 A1 * | 2/2015 | Liu ...................... H05K 7/1409 312/223.2 |
| 2016/0018859 A1 * | 1/2016 | Mao ..................... H05K 7/1487 361/679.58 |
| 2016/0095237 A1 * | 3/2016 | Hou .......................... F16B 2/10 361/679.58 |

FOREIGN PATENT DOCUMENTS

TW   201613448   4/2016

OTHER PUBLICATIONS

"Office Action of Taiwan Counterpart Application," dated Dec. 17, 2019, p. 1-p. 7.

* cited by examiner

*Primary Examiner* — Nidhi Thaker
(74) *Attorney, Agent, or Firm* — JCIPRNET

(57) ABSTRACT

An unlocking structure adapted to an insert slot is provided. An expansion card is adapted to be inserted into the insert slot and fixed on the insert slot by a locking component. The unlocking structure includes a base and an operation shaft. The base is fixed on the insert slot. The operation shaft is pivoted to the base. The operation shaft is adapted to rotate in relative to the base from a locking position to an unlocking position to drive the locking component to be separated from the expansion card. In addition, an electronic device having the unlocking structure and an electronic module having the unlocking structure are also provided.

20 Claims, 19 Drawing Sheets

UNLOCKING STRUCTURE AND ELECTRONIC DEVICE

CROSS-REFERENCE TO RELATED APPLICATION

This application claims the priority benefit of China application serial no. 201910237665.7, filed on Mar. 27, 2019. The entirety of the above-mentioned patent application is hereby incorporated by reference herein and made a part of this specification.

BACKGROUND OF THE INVENTION

1. Field of the Invention

The invention relates to an unlocking structure, an electronic device and an electronic module, and more particularly, to an unlocking structure having an operation shaft, an electronic device having said unlocking structure and an electronic module having said unlocking structure.

2. Description of Related Art

An automotive driverless simulation test refers to a way of completing a driverless car road test work by constructing a virtual driving scene that simulates a road test environment with use of algorithms and technologies including sensor simulation, vehicle dynamics simulation, advanced graphics processing, traffic flow simulation, digital simulation, road modeling and the like. Other than needing good performance of an analog simulator, a server used in the automotive driverless simulation test also needs to support a sufficient quantity of system expansion cards in order to support the modeling of the road test environment and the construction of the virtual driving scene as much as possible. The expansion cards are usually connected to insert slots on a motherboard the server by a gold finger, and most of the expansion cards need to be connected to the analog simulator by a large number of cables.

To prevent connection between the expansion cards and the motherboard from loosening or falling off when the user assembles or disassembles the cables, certain insert slots on the motherboard are disposed with a locking mechanism for locking the expansion cards on the insert slots. When removing the expansion card, the user needs to press the locking mechanism for unlocking the expansion card. When the expansion card has a larger size and a larger number, the locking mechanism is shielded by the expansion cards, so that the user does not have enough space to press the locking mechanism.

SUMMARY OF THE INVENTION

The invention provides an unlocking structure, which can smoothly perform an unlocking operation.

The invention provides an electronic device, in which an unlocking structure can smoothly perform an unlocking operation.

The invention provides an electronic module, in which an unlocking structure can smoothly perform an unlocking operation.

The unlocking structure of the invention is adapted to an insert slot. An expansion card is adapted to be inserted into the insert slot and fixed on the insert slot by a locking component. The unlocking structure includes a base and an operation shaft. The base is fixed on the insert slot. The operation shaft is pivoted to the base. The operation shaft is adapted to rotate in relative to the base from a locking position to an unlocking position to drive the locking component to be separated from the expansion card.

The electronic device of the invention includes a main body, a locking component and an unlocking structure. The main body has at least one insert slot. An expansion card is adapted to be inserted into the insert slot. The expansion card is adapted to be fixed on the insert slot by the locking component. The unlocking structure includes a base and an operation shaft. The base is fixed on the insert slot. The operation shaft is pivoted to the base. The operation shaft is adapted to rotate in relative to the base from a locking position to an unlocking position to drive the locking component to be separated from the expansion card.

The electronic module of the invention includes a motherboard, a locking component and an unlocking structure. The motherboard has at least one insert slot. An expansion card is adapted to be inserted into the insert slot. The expansion card is adapted to be fixed on the insert slot by the locking component. The unlocking structure includes a base and an operation shaft. The base is fixed on the insert slot. The operation shaft is pivoted to the base. The operation shaft is adapted to rotate in relative to the base from a locking position to an unlocking position to drive the locking component to be separated from the expansion card.

In an embodiment of the invention, the object has a bottom portion and a top portion opposite to each other and is adapted to be inserted into the insert slot by the bottom portion, and an end portion of the operation shaft protrudes over the top portion of the object when the operation shaft is located at the locking position or the unlocking position.

In an embodiment of the invention, the operation shaft is located at the locking position when an angle of the operation shaft relative to the base is a first angle, and the operation shaft is located at the unlocking position when the angle of the operation shaft relative to the base is a second angle greater than the first angle.

In an embodiment of the invention, the locking component is movably disposed in the insert slot and the operation shaft is adapted to push the locking component such that the locking component rotates in relative to the insert slot.

In an embodiment of the invention, the locking component is connected to the operation shaft and adapted to rotate with the operation shaft.

In an embodiment of the invention, the operation shaft has a pressing part, and the operation shaft is adapted to press the locking component by the pressing part to push the expansion card by the locking component such that the expansion card is separated from the insert slot.

In an embodiment of the invention, the operation shaft is adapted to rotate in relative to the base to a folded position to be close to the base.

In an embodiment of the invention, the unlocking structure includes an elastic component. The elastic component is connected between the base and the operation shaft, and the operation shaft is adapted to be positioned at the locking position or the unlocking position by an elastic force of the elastic component.

In an embodiment of the invention, the base has a first stopper, and the first stopper is adapted to resist the elastic force of the elastic component and stop the operation shaft at the locking position.

In an embodiment of the invention, the base has a pivot hole, the operation shaft has a pivot shaft, the pivot shaft is pivoted to the pivot hole, a length of the pivot hole in a moving direction is greater than an outside diameter of the pivot shaft, and the pivot shaft is adapted to move in relative to the base in the moving direction while the operation shaft rotates such that the operation shaft crosses over the first stopper.

In an embodiment of the invention, the first stopper is a bump extended from a side wall of the base and adjacent to the operation shaft located at the locking position.

In an embodiment of the invention, the base has a second stopper, and the operation shaft is adapted to be stopped by the second stopper at the unlocking position, the second stopper is a top surface of a side wall of the base and adjacent to the operation shaft located at the unlocking position.

In an embodiment of the invention, the base has a flange, and the flange engages with the insert slot.

In an embodiment of the invention, at least one side wall of the base and the insert slot stop each other.

Based on the above, because the unlocking structure of the invention has the operation shaft, the user may apply force to the operation shaft to drive the locking component for unlocking without directly pressing the locking component. As a result, even if the locking component is shielded by the object inserted in the insert slot, the user can still smoothly detach the expansion card.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
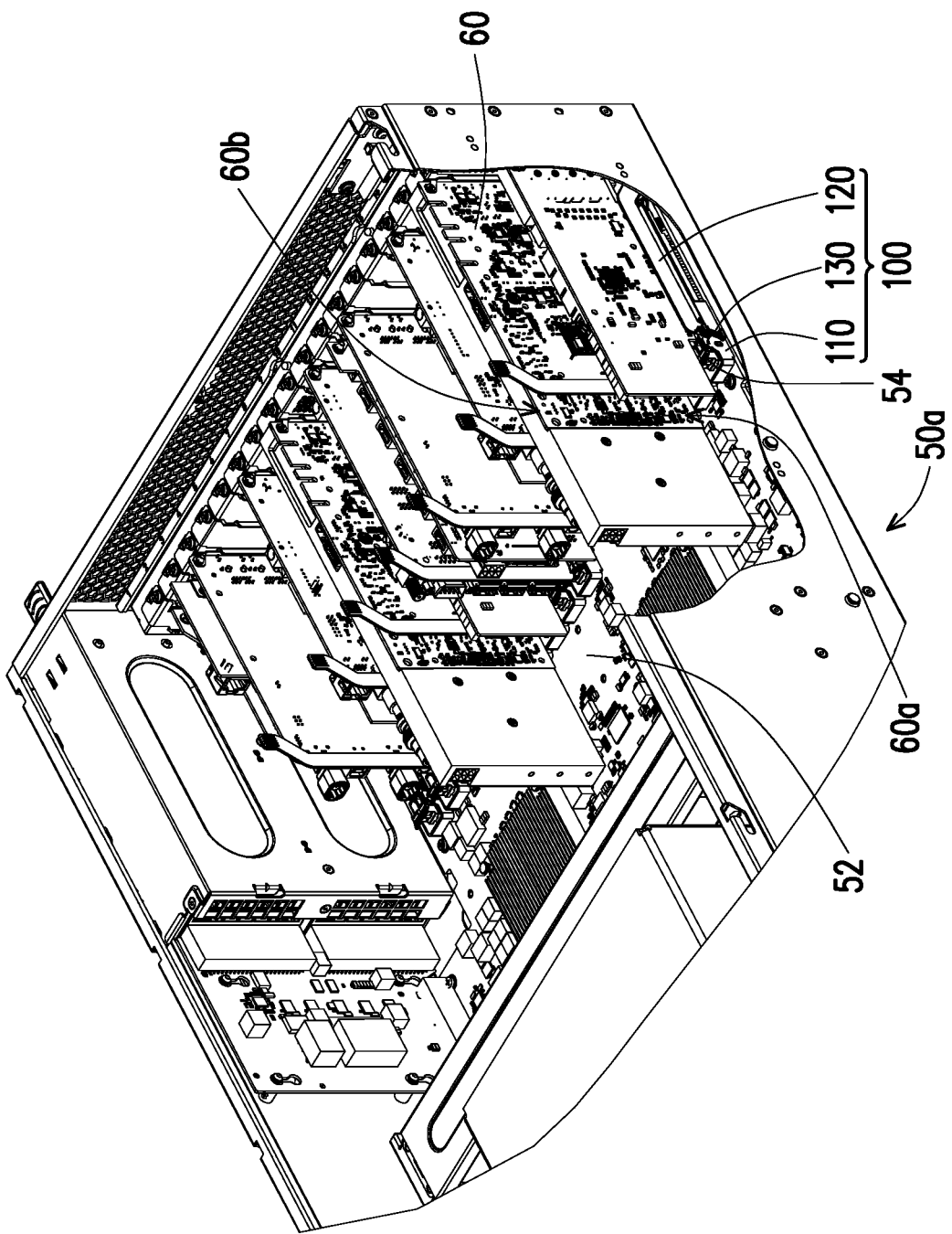
FIG. 1 is a partial perspective view of an electronic device according to an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
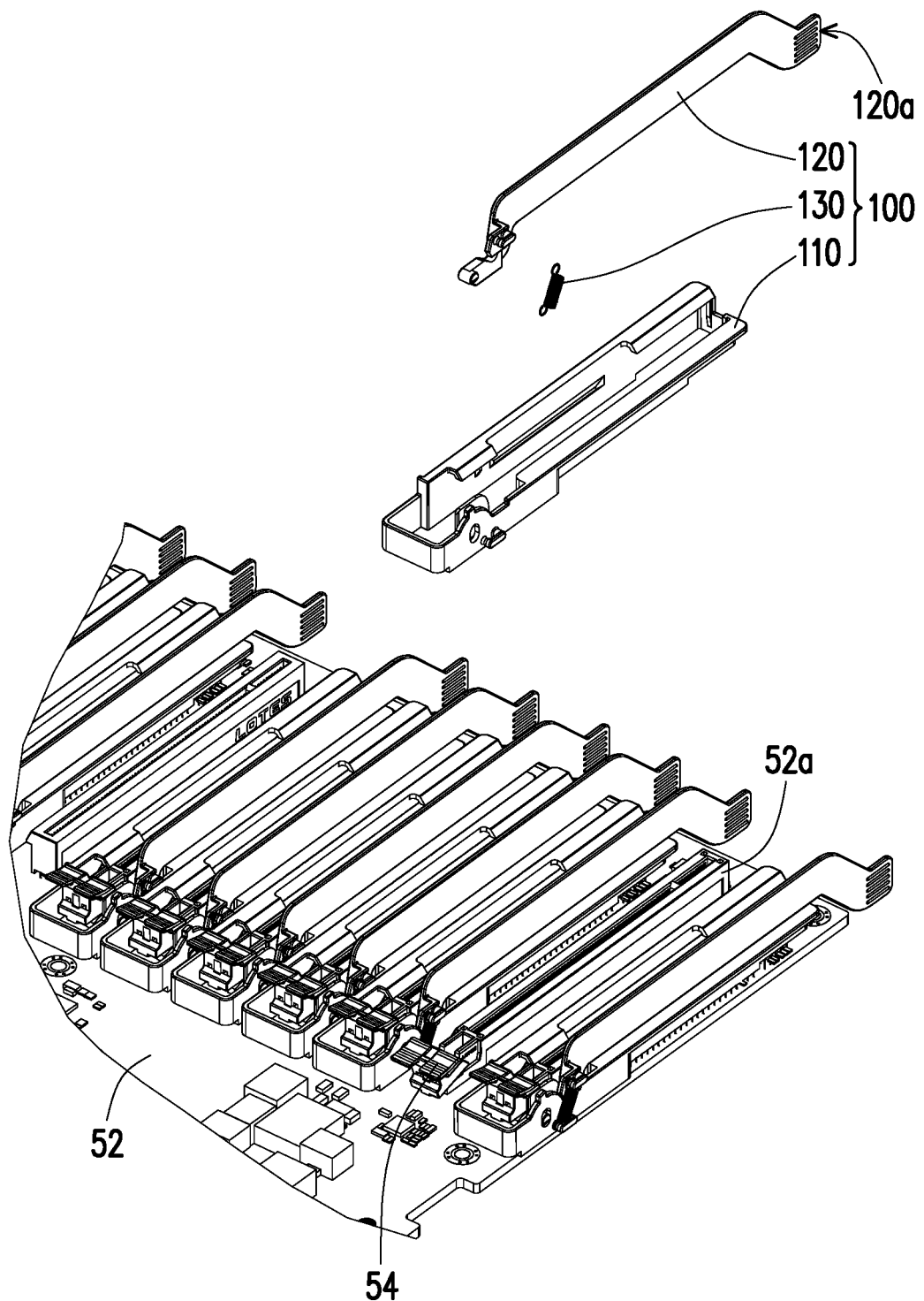
FIG. 2 is a breakdown drawing of certain components in the electronic device of FIG. 1.

FIG. 1 is a partial perspective view of an electronic device according to an embodiment of the invention. FIG. 2 is a breakdown drawing of certain components in the electronic device of FIG. 1. For clarity of the drawing, an object 60 is not shown in FIG. 2, and all operation shafts 120 in FIG. 2 are illustrated as in a folded state. With reference to FIG. 1 and FIG. 2, an electronic device 50 of the present embodiment is, for example, a server and includes a main body 50a, at least one locking component 54 (illustrated as a plurality) and at least one unlocking structure 100 (illustrated as a plurality). A motherboard 52 on the main body 50a has at least one insert slot 52a (illustrated as a plurality), and at least one object 60 (illustrated as a plurality of expansion cards) is adapted to be inserted into the insert slot 52. The motherboard 52 and the unlocking structure 100 constitute an electronic module. The locking component 54 is movably disposed in the insert slot 52a, and the object 60 is adapted to be fixed on the insert slot 52a by the locking component 54. The unlocking structure 100 includes a base 110 and an operation shaft 120, and the operation shaft 120 is, for example, in shape of a long flat strip. The base 110 is fixed on a periphery of the insert slot 52a. The operation shaft 120 is pivoted to the base 110 and configured to push the locking component 54 such that the locking component 54 rotates in relative to the insert slot 52a to separate and unlock the object 60.

Figure 3A:
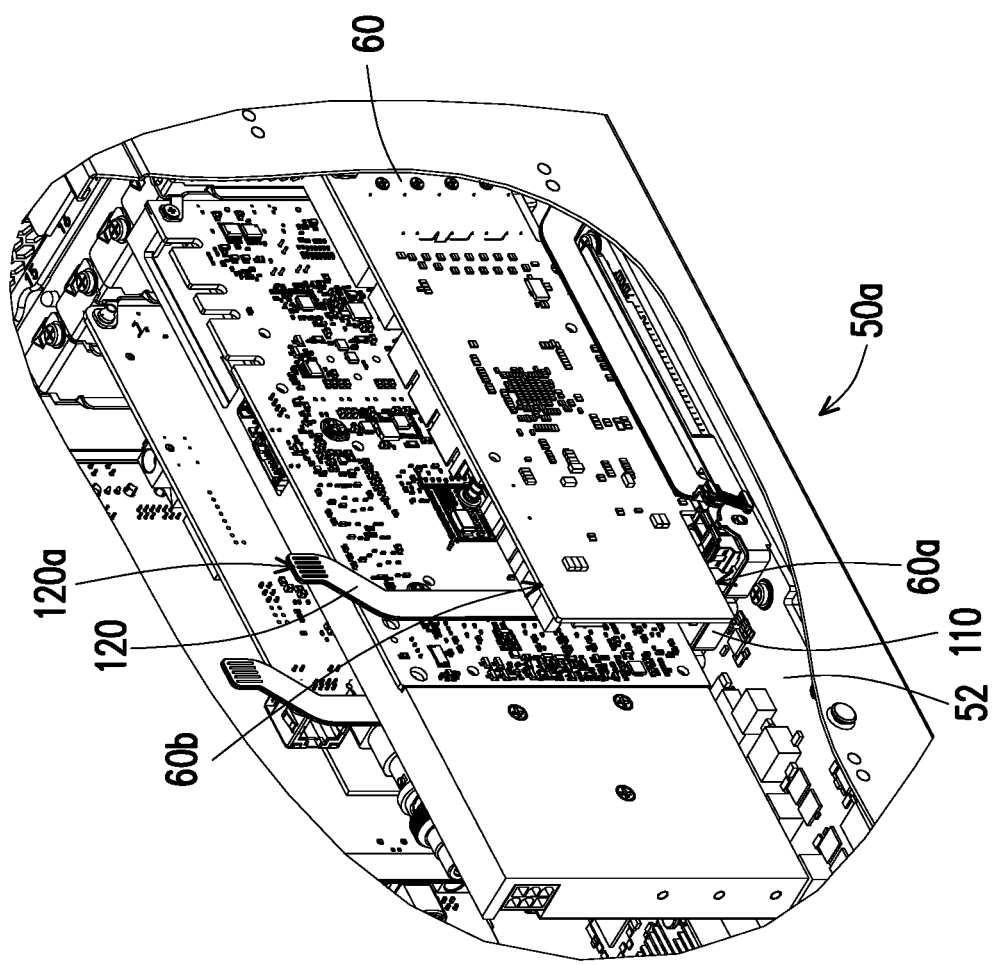
FIG. 3A and FIG. 3B illustrate an operating process of the unlocking structure of FIG. 1.
Figure 3B:
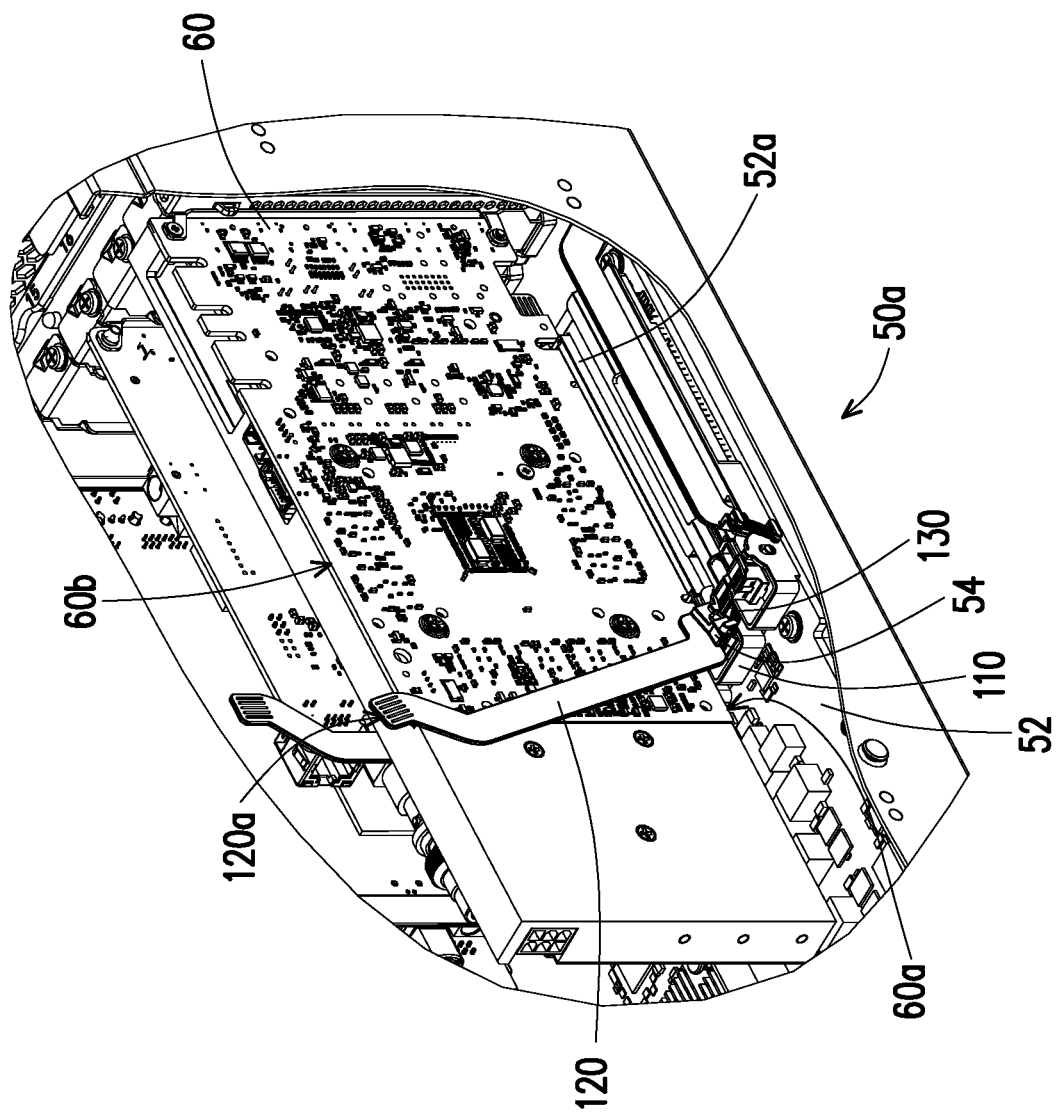

FIG. 3A and FIG. 3B illustrate an operating process of the unlocking structure of FIG. 1. With reference to FIG. 3A and FIG. 3B, specifically, the user may apply force to the operation shaft 120 to such that the operation shaft 120 rotates in relative to the base 110 from a locking position shown by FIG. 3A to a unlocking position shown by FIG. 3B to drive the locking component 54 to unlock the object 60. In other words, the user does not need to directly press the locking component 54 for unlocking. Accordingly, even if the locking component 54 is shielded by the object 60 inserted in the insert slot 52a, the user can still smoothly detach the object 60.

With reference to FIG. 1, FIG. 3A and FIG. 3B, in this embodiment, each of the objects 60 has a bottom portion 60a and a top portion 60b opposite to each other and is adapted to be inserted into the insert slot 52a (shown in FIG. 2) by the bottom portion 60a. When the operation shaft 120 is located at the locking position shown by FIG. 3 or the unlocking position shown by FIG. 3B, an end portion 120a of the operation shaft 120a protrudes over the top portion 60b of each of the objects 60. In this way, the user may apply force to the end portion 120a of the operation shaft 120, so as to smoothly make the operation shaft 120 rotate. In addition, when the object 60 is not inserted in the insert slot 52a corresponding to the operation shaft 120, the user may apply force to the operation shaft 120 such that the operation shaft 120 rotates in relative to the base 110 to a folded position shown by FIG. 2 to be close to or folded into the base 110.

FIG. 4A to FIG. 4D illustrate various operating states of the operation shaft of FIG. 1, and the states shown by FIG. 4A to FIG. 4D respectively correspond to the states shown by FIG. 3A and FIG. 3B. With reference to FIG. 4A to FIG. 4D, specifically, the base 110 of the present embodiment has a pivot hole 110a, the operation shaft 120 has a pivot shaft 122, and the operation shaft 120 is pivoted to the pivot hole 110a of the base 110 by the pivot shaft 122. Further, the base 110 has a first stopper 112, and the first stopper 122 is, for example, a bump extended from a side wall 119 of the base 110 and adjacent to the operation shaft 120 located at the locking position. The operation shaft 120 is adapted to be stopped at the locking position shown by FIG. 4C by the first stopper 112. At this time, an angle of the operation shaft 120 in relative to the base 110 is, for example, 90 degrees (a first angle). Similarly, the base 110 has a second stopper 114, and the second stopper 114 is, for example, a top surface of the side wall 119 of the base 110 and adjacent to the operation shaft 120 located at the unlocking position. The operation shaft 120 is adapted to be stopped at the unlocking position shown by FIG. 4D by the second stopper 114. At this time, the angle of the operation shaft 120 in relative to the base 110 is, for example, slightly greater than 90 degrees (a second angle).

More specifically, the unlocking structure 100 of the present embodiment further includes an elastic component 130, and the elastic component 130 is, for example, a spring, and connected between the base 100 and the operation shaft 120. The first stopper 112 is adapted to resist an elastic force of the elastic component 130 and stop the operation shaft 120 at the locking position. Specifically, when the operation shaft 120 is located at the locking position shown by FIG. 4C, the elastic component 130 and the first stopper 112 are located on the same side of the pivot shaft 122 and the elastic component 130 is in a stretched state such that the operation shaft 120 is positioned at the locking position shown by FIG. 4C by a torque generated by component force of the elastic force of the elastic member 130. Similarly, when the operation shaft 120 is located at the unlocking position shown by FIG. 4D, the elastic component 130 and the second stopper 114 are located on the same side of the pivot shaft 122 and the elastic component 130 is in the stretched state such that the operation shaft 120 is positioned at the unlocking position shown by FIG. 4D by a torque generated by component force of the elastic force of the elastic member 130. Similarly, when the operation shaft 120 is located at the folded position shown by FIG. 4A, the operation shaft 120 is positioned at the folded position shown by FIG. 4A by a torque generated by component force of the elastic force of the elastic member 130. At this time, the angle of the operation shaft 120 in relative to the base 110 is, for example, 0 degree.

In this embodiment, a length of the pivot hole 110a of the base 110 in a moving direction D (marked in FIG. 4A) is greater than an outside diameter of the pivot shaft 122 of the operation shaft 120. Accordingly, while the operation shaft 120 rotates, the pivot shaft 122 can move in relative to the base 110 in the moving direction D from the position shown by FIG. 4A to the position shown by FIG. 4B so that the operation shaft 120 can cross over the first stopper 112 and continue to rotate to the locking position shown by FIG. 4C or the unlocking position shown by FIG. 4D. Similarly, while the operation shaft 120 rotates, the pivot shaft 122 can move in relative to the base 110 in the moving direction D from the position shown by FIG. 4C to the position shown by FIG. 4B so the operation shaft 120 can be moved up slightly to cross over the first stopper 112 and continue to rotate to the folded position shown by FIG. 4A.

FIG. 5A to FIG. 5D illustrate various operating states of the locking component of FIG. 1, and the states shown by FIG. 5A to FIG. 5D respectively correspond to the states shown by FIG. 4A to FIG. 4D. With reference to FIG. 5A to FIG. 5D, the locking component 54 of the present embodiment includes a pushing part 54a and a pressure receiving part 54b. When the operation shaft 120 is operated between the states shown by FIG. 5A to FIG. 5C, the pressure receiving part 54b is not yet pressed down by the operation shaft 120. When the object 60 is inserted in the insert slot 52a and the operation shaft 120 is operated to a unlocked state shown by FIG. 5A, a pressing part 124 of the operation shaft 120 presses the pressure receiving part 54b of the locking component 54 to drive the locking component 54 to rotate to separate and unlock the object 60, and the pushing part 54a pushes the object 60 such that the object 60 is separated from the insert slot 52a. In addition, the locking component 54 of the present embodiment has a positioning slot 54c. In a locked state shown by FIG. 5C, a positioning part 62 of the object 60 is inserted into the positioning slot 54c to position the object 60.

It should be noted that, when the angle is less than 90 degrees, inserting the object 60 into the insert slot 52a may make the end portion 120a of the operation shaft 120 unable to protrude over the top portion 60b of the object 60. Therefore, it is not recommended to insert the object 60 into the insert slot 52a when the angle is less than 90 degrees. In accordance with the above, when the angle of the operation shaft 120 relative to the base 110 falls within a range from 0 to 90 degrees, since the operation shaft 120 does not drive the locking component 54 to rotate to the unlocked state, the locking component 54 is still in the locked state. However, because the object 60 is not inserted in the insert slot 52a and is thus not locked when the angle is less than 90 degrees, the operation shaft 120 is defined as only being located at the locking position when the angle is 90 degrees.

Figure 4A:
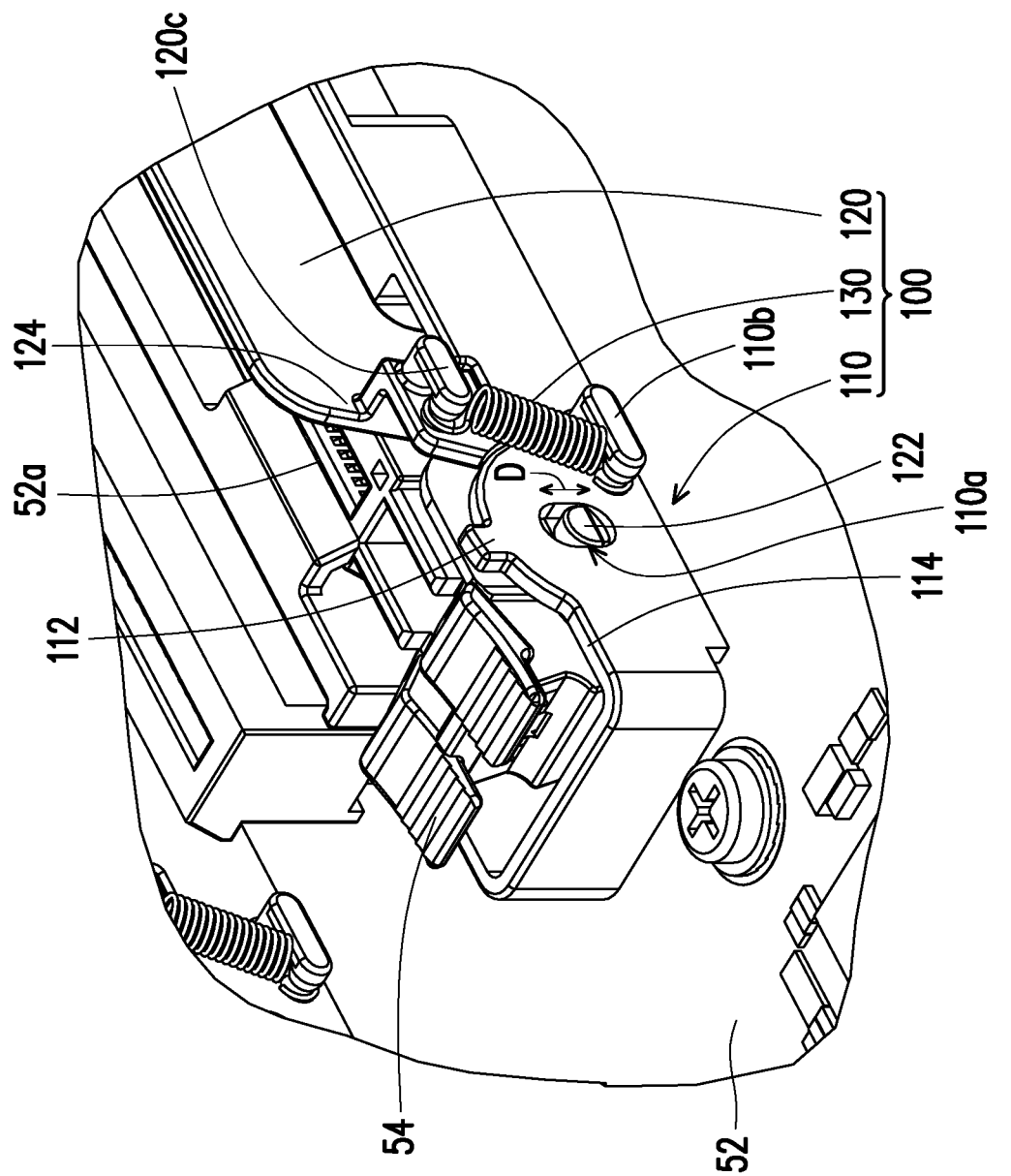
FIG. 4A to FIG. 4D illustrate various operating states of the operation shaft of FIG. 1.
Figure 4B:
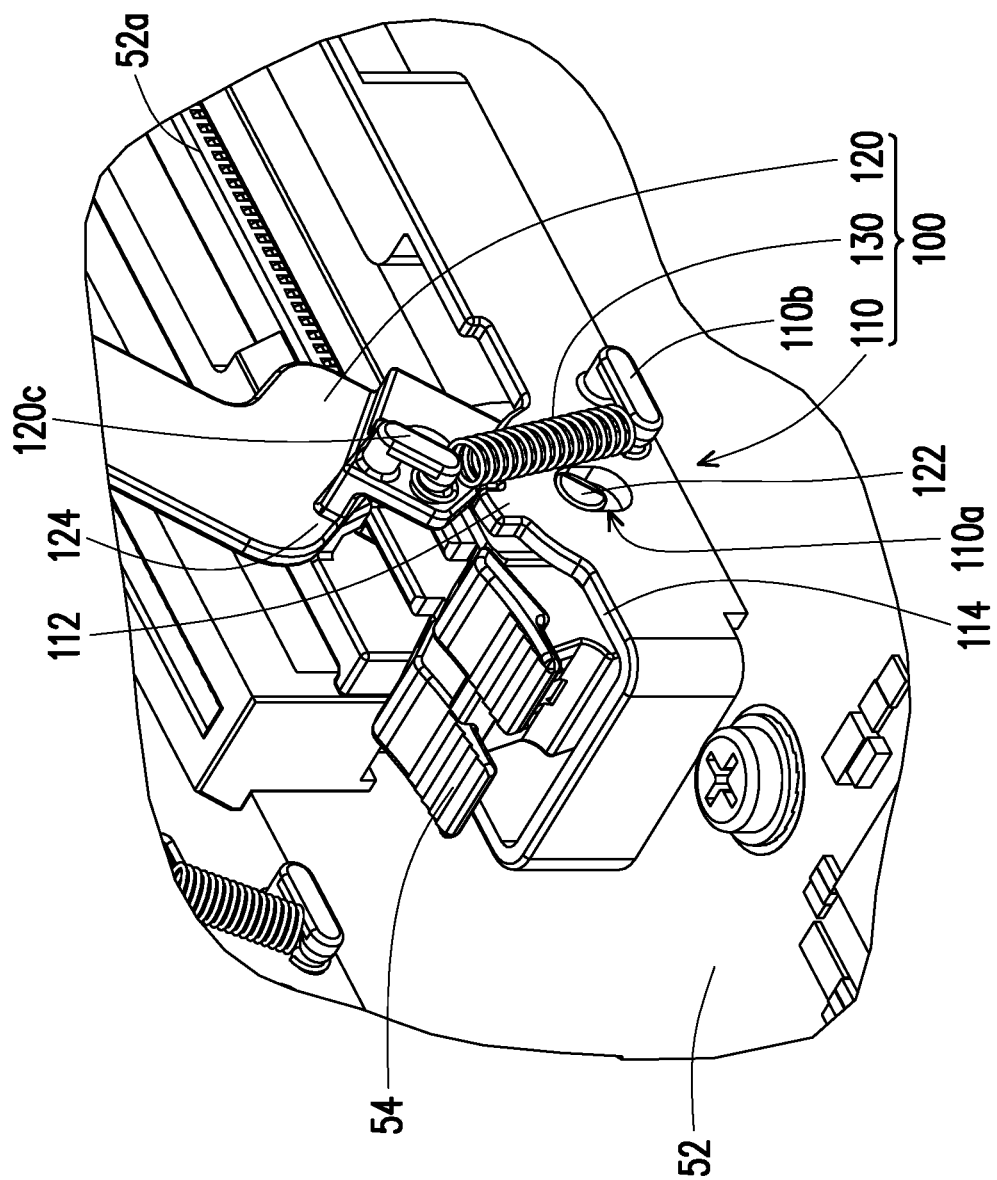
Figure 4C:
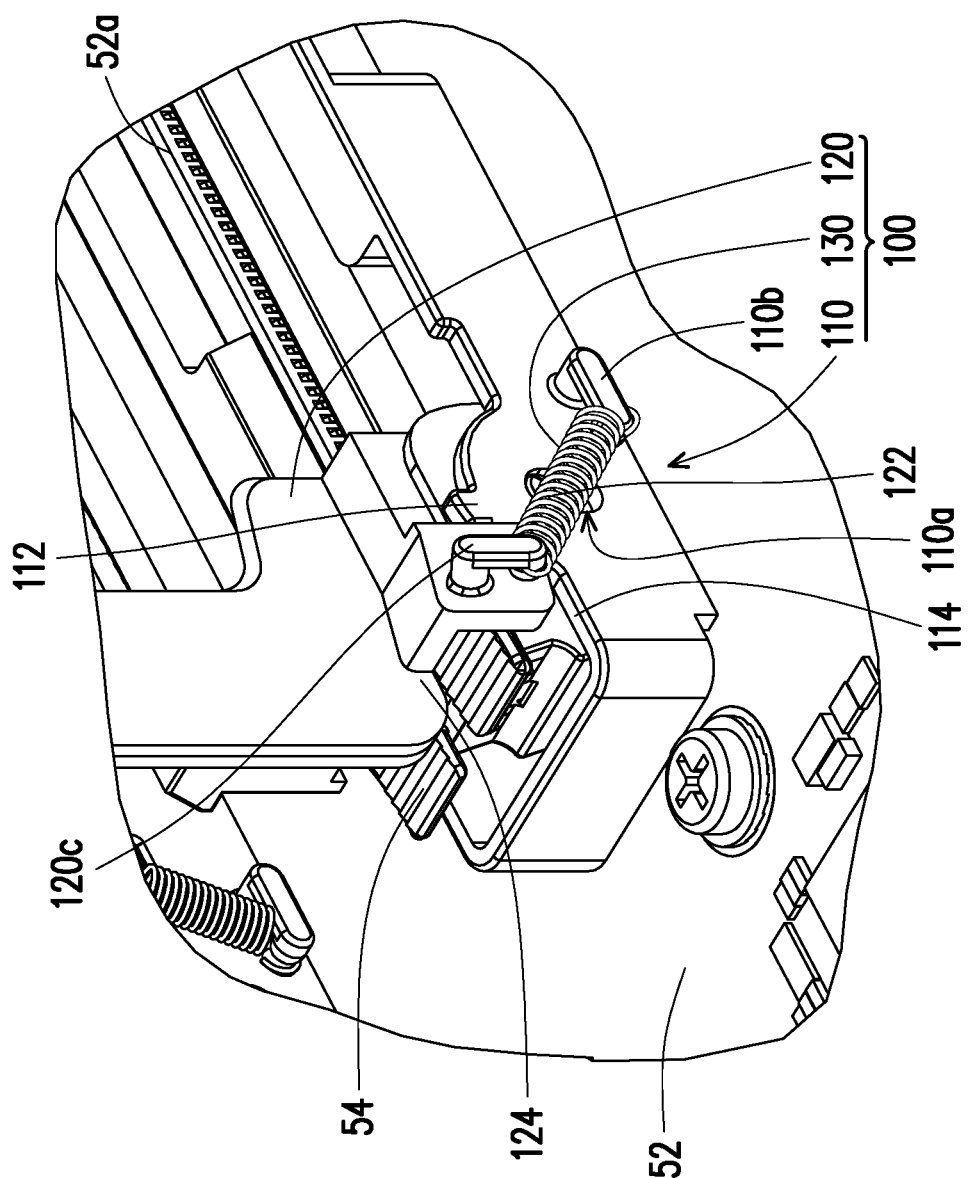
Figure 4D:
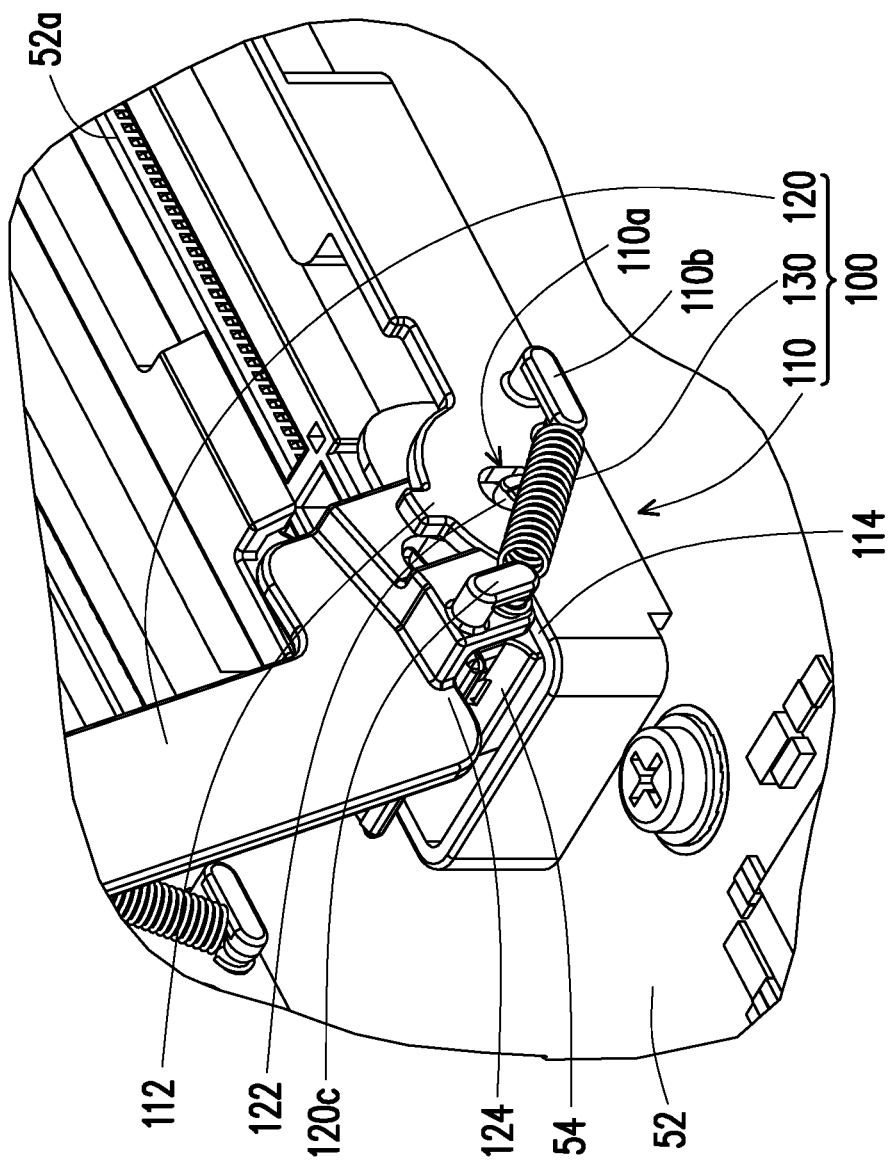
Figure 5A:
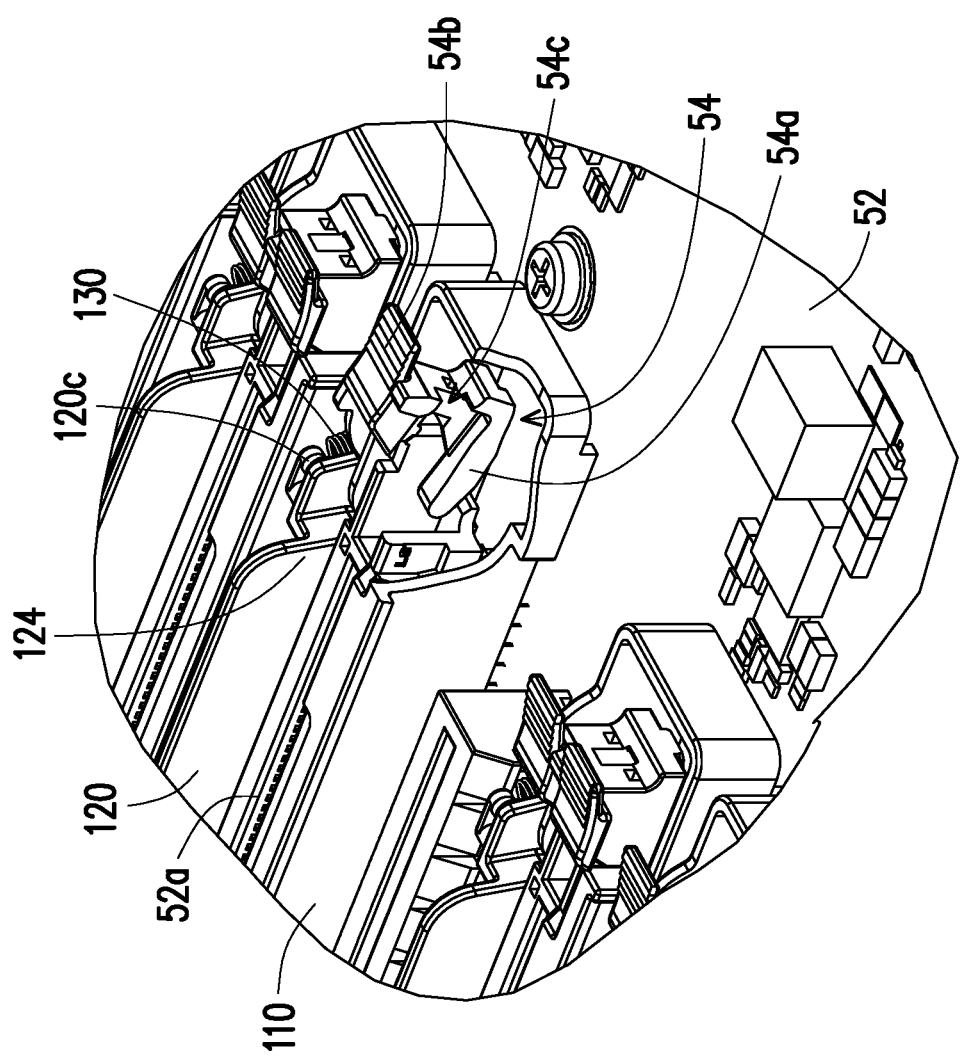
FIG. 5A to FIG. 5D illustrate various operating states of the locking component of FIG. 1.
Figure 5B:
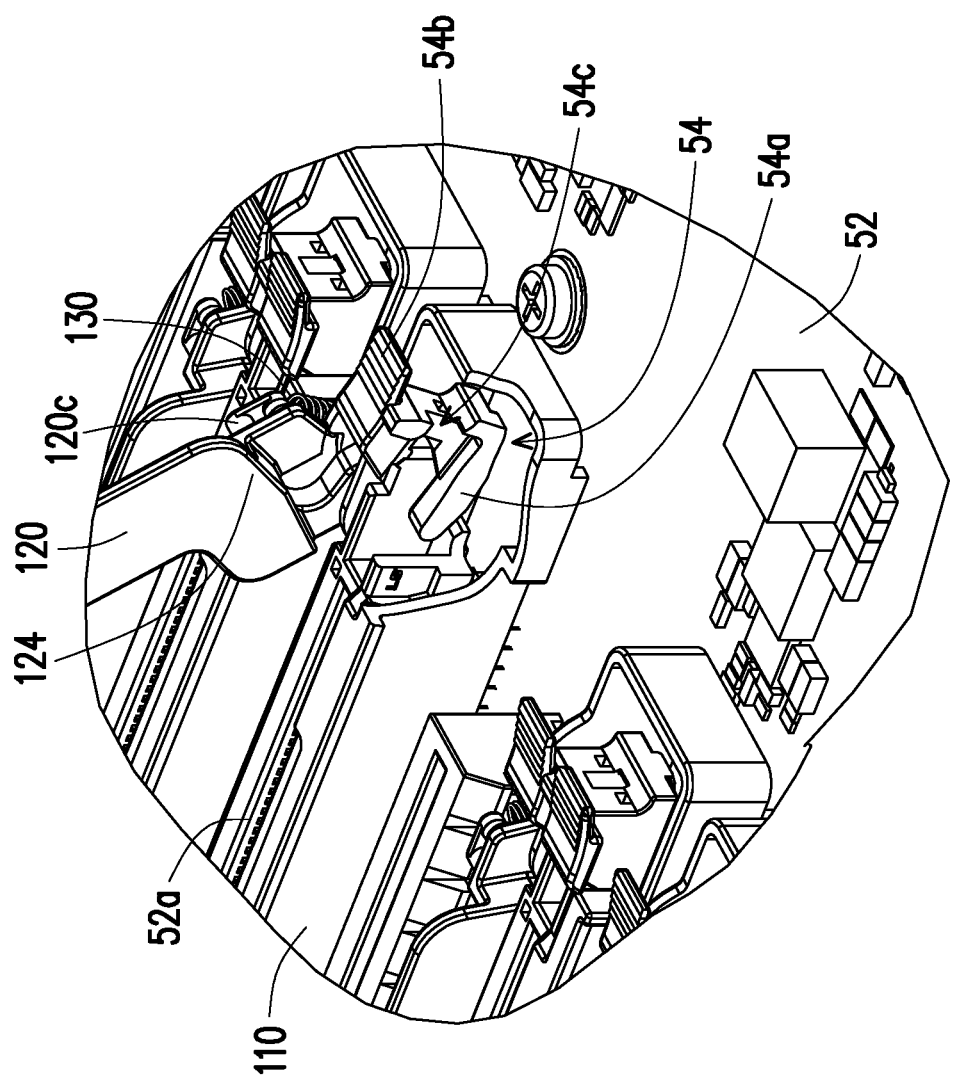
Figure 5C:
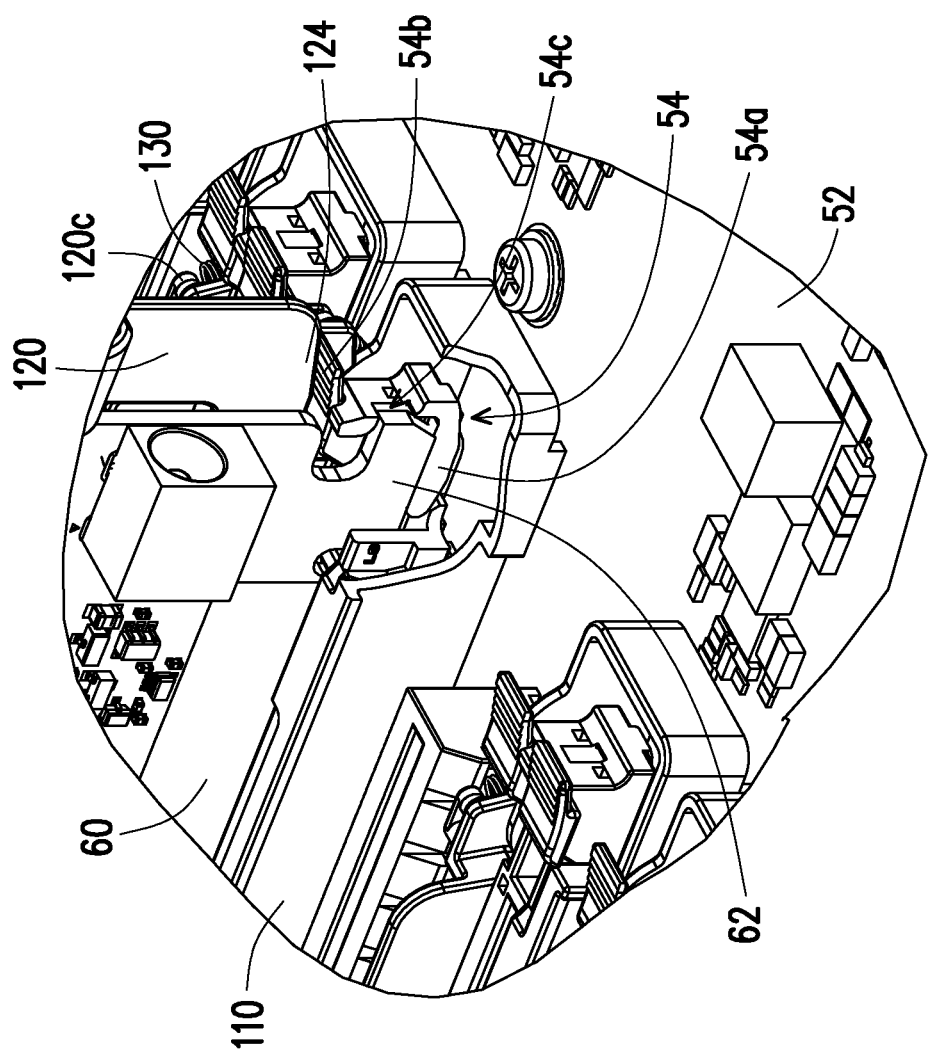
Figure 5D:
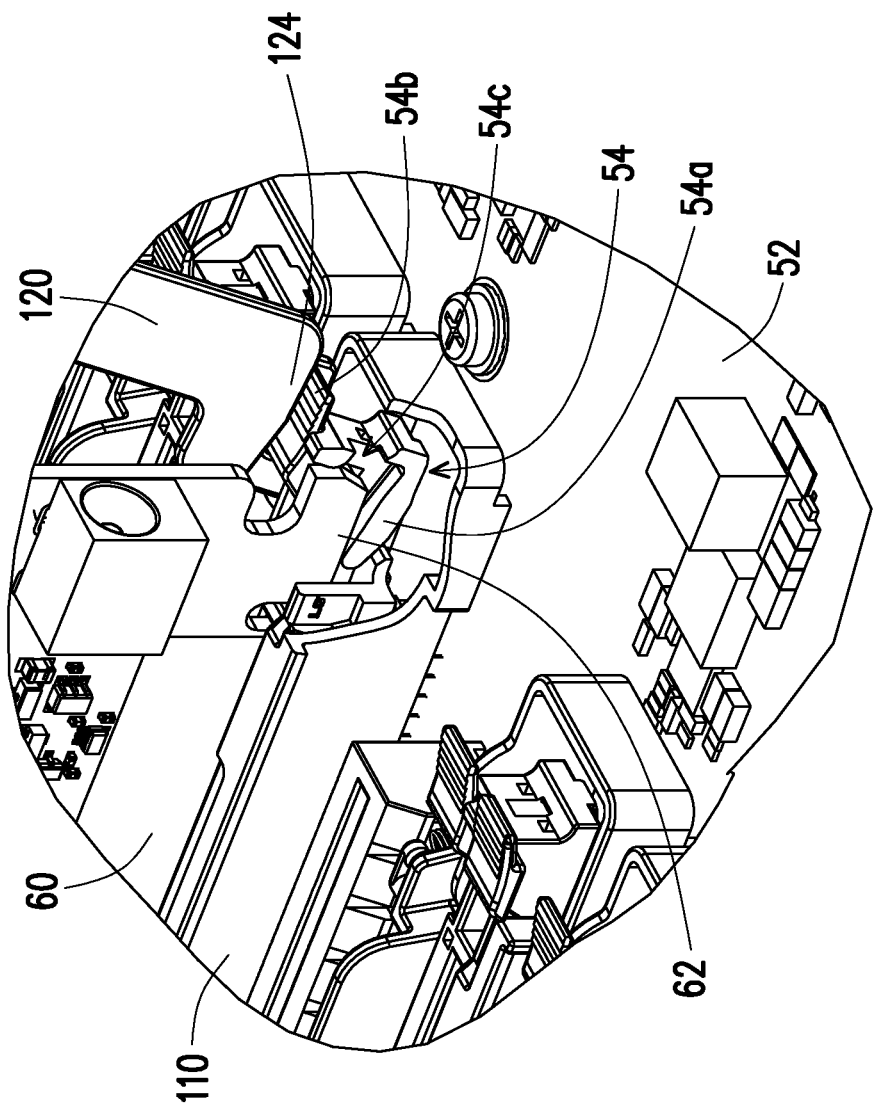

An installing process of the object 60 is described as follows. When the object 60 is not inserted in the insert slot 52a as shown by FIG. 5A and the user intends to insert the object 60 into the insert slot 52a, the user may apply force to the operation shaft 120 such that the operation shaft 120 rotates from the folded position shown by FIG. 5A to the unlocking position shown by FIG. 5D and the angle of the operation shaft 120 relative to the base 110 is increased from 0 degree to slightly greater than 90 degrees. During this process, the operation shaft 120 needs to be moved up slightly to cross over the first stopper 112 as shown by FIG. 4B. Then, the object 60 is inserted into the insert slot 52a as shown by FIG. 5C. During the process of inserting the object 60 into the insert slot 52a, the object 60 presses down the pushing part 54a of the locking component 54 as shown by FIG. 5D to FIG. 5C to drive the locking component 54 to rotate to the state shown by FIG. 5C such that the positioning part 62 of the object 60 is inserted into the positioning slot 54c of the locking component 54 with rotation of the locking component 54 and the operation shaft 120 is pushed to the locked state shown by FIG. 5C by the pressure receiving part 54b of the locking component 54 with rotation of the locking component 54 to thereby finish inserting the object 60.

A detaching process of the object 60 is described as follows. When the object 60 is inserted in the insert slot 52a (marked in FIG. 5A) as shown by FIG. 5C and the user intends to detach the object 60, the user my apply force to the operation shaft 120 such that the operation shaft 120 rotates from the locked state shown by FIG. 5C to the unlocked state shown by FIG. 5D. During this process, the operation shaft 120 presses down the pressure receiving part 54b of the locking component 54b to drive the locking component 54 to rotate from the state shown by FIG. 5C to the state shown by FIG. 5D such that the positioning part 62 of the object 60 is separated from the positioning slot 54c of the locking component 54 with rotation of the locking component 54 and the pushing part 54a of the locking component 54 lifts up the object 60. Accordingly, the user can pick up the object 60 to finish detaching the object 60. After picking up the objects 60, the user may apply force to the operation shaft 120 such that the operation shaft 120 rotates from the unlocking position shown by FIG. 5D to the folded position shown by FIG. 5A and the angle of the operation shaft 120 relative to the base 110 is reduced from slightly greater than 90 degrees to 0 degree. During this process, the operation shaft 120 needs to be moved up slightly to cross over the first stopper 112 as shown by FIG. 4B.

Figure 6:
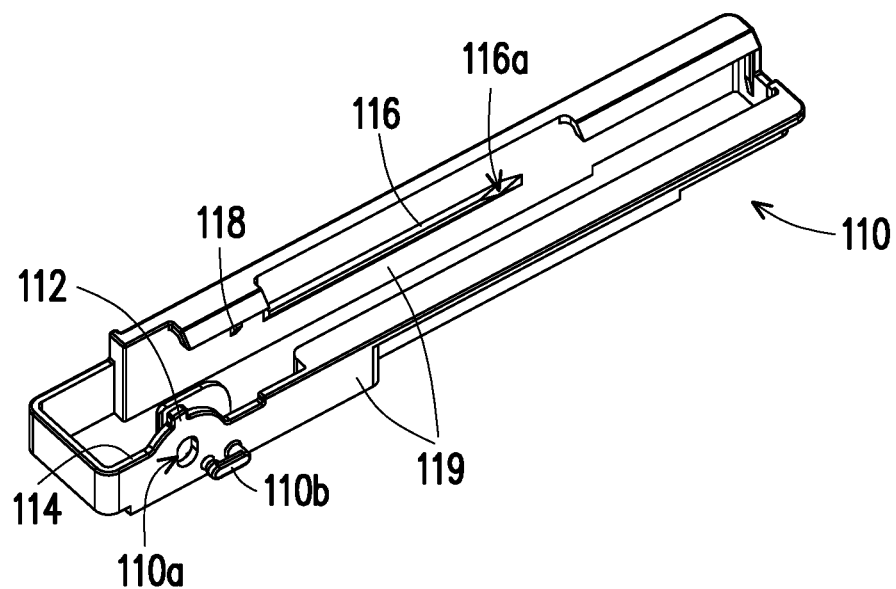
FIG. 6 is a perspective view of the base of FIG. 1.
Figure 7:
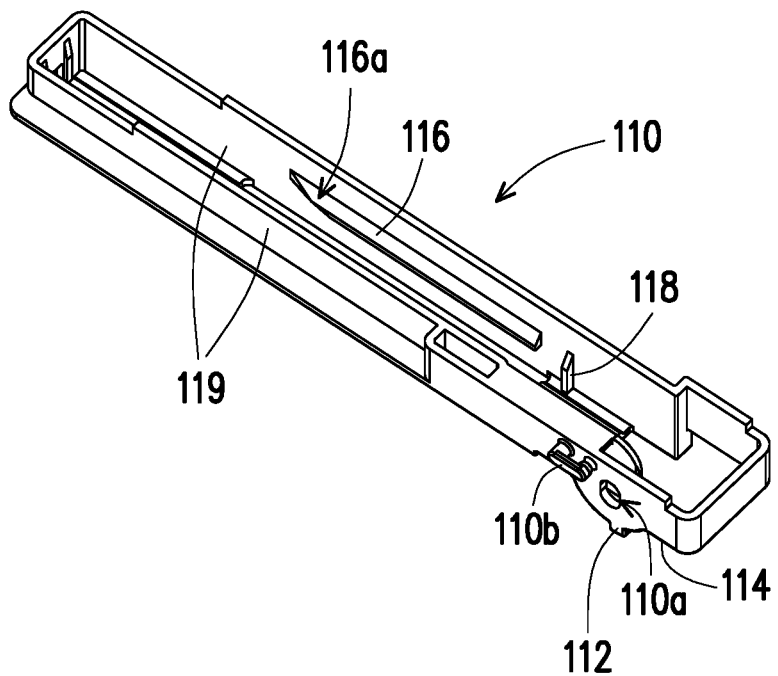
FIG. 7 is a perspective view of the base of FIG. 6 from another angle.
Figure 8:
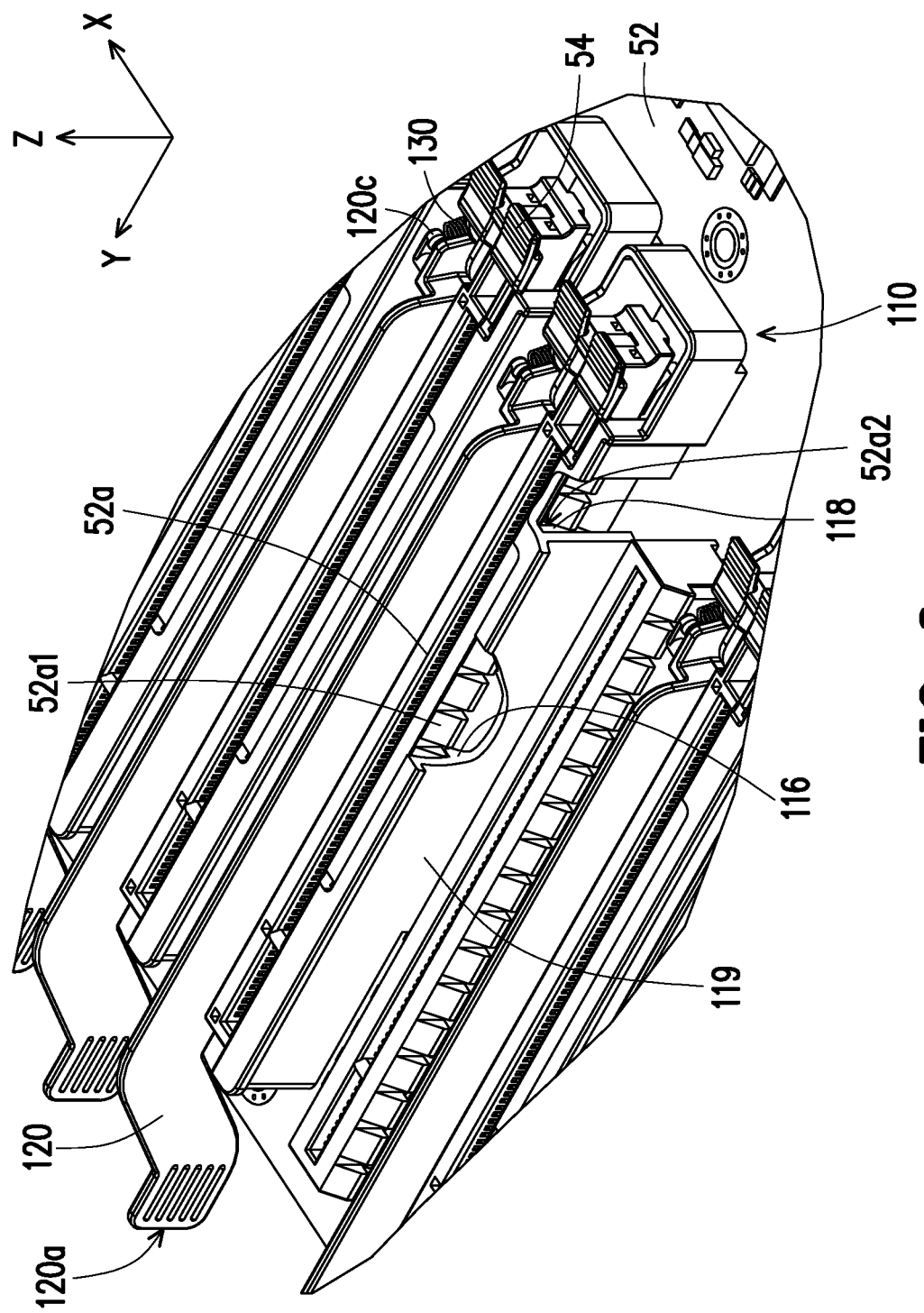
FIG. 8 illustrates a manner of fixing the base of FIG. 1.

Structure of the base 110 of the present embodiment is described in details as follows. FIG. 6 is a perspective view of the base of FIG. 1. FIG. 7 is a perspective view of the base of FIG. 6 from another angle. FIG. 8 illustrates a manner of fixing the base of FIG. 1. With reference to FIG. 6 to FIG. 8, the base 110 of the present embodiment has a flange 116 and the insert slot 52a has a hook 52a1 as shown by FIG. 8 so the hook 52a1 and the flange 116 can engage with each other to prevent the base 110 from moving in a direction Z. In addition, the base 110 has a rib 118 and the hook 52a1 of the insert slot 52a has a groove 52a2 so the rib 118 can engage with the groove 52a2 to prevent the base 110 from moving in a direction Y. The side wall 119 of the base 110 and the insert slot 52a stop each other to prevent the base 110 from moving in a direction X.

Figure 9:
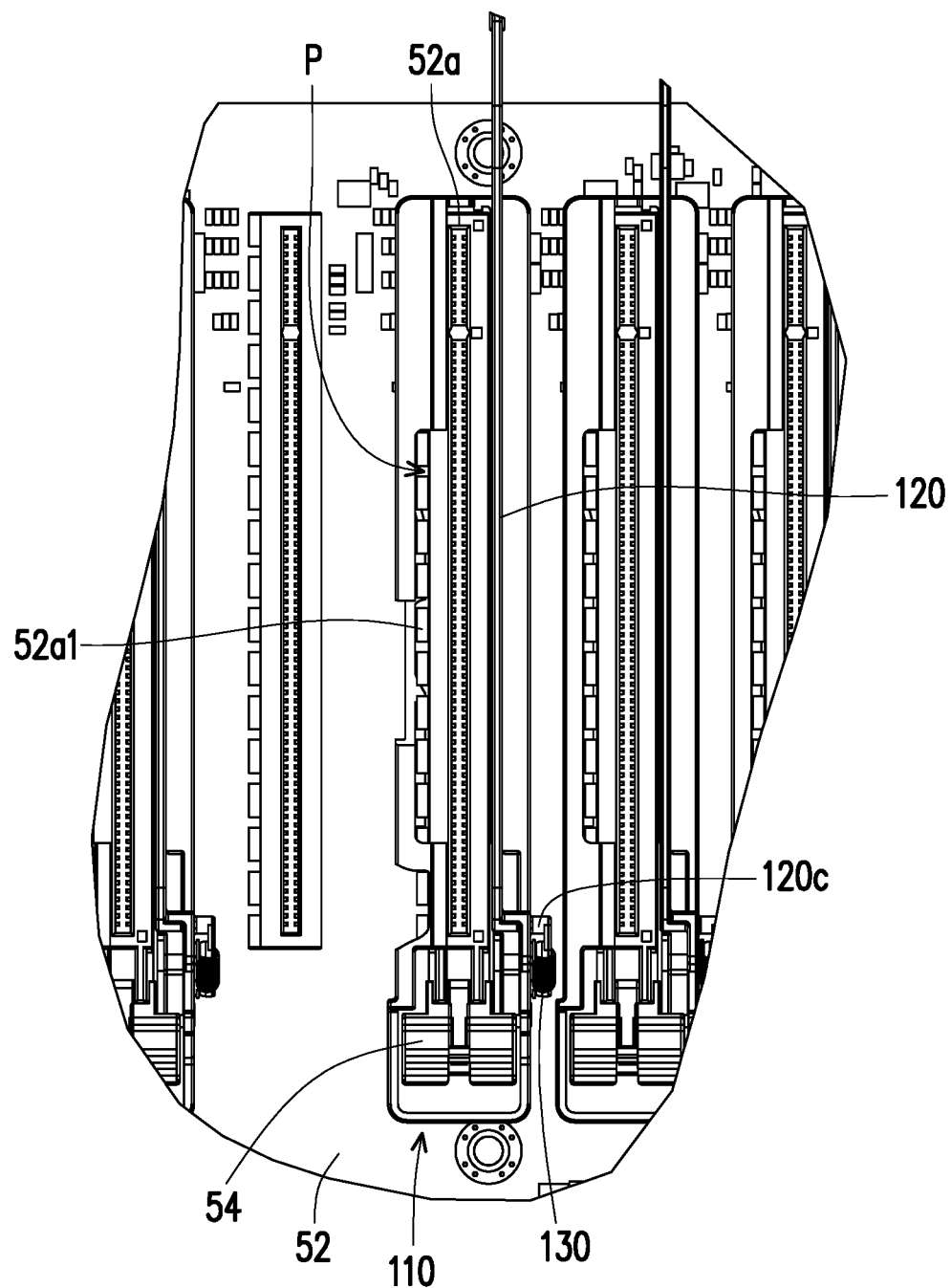
FIG. 9 is a partial top view of the electronic device of FIG. 1.

FIG. 9 is a partial top view of the electronic device of FIG. 1. In this embodiment, one end of the flange 116 of the base 110 has a guiding oblique part 116a as shown by FIG. 6 and FIG. 7. When the base 110 is to be detached, a tool (e.g., a flathead screwdriver) may be guided by the guiding oblique part 116a at a position P shown by FIG. 9 (i.e., where the guiding oblique part 116a is located) to be inserted between the base 110 and the insert slot 52a, such that the base 110 may be lifted up to release engagement of the flange 116 and the hook 52a1 so the base 110 can be separated from the insert slot 52a.

Figure 10:
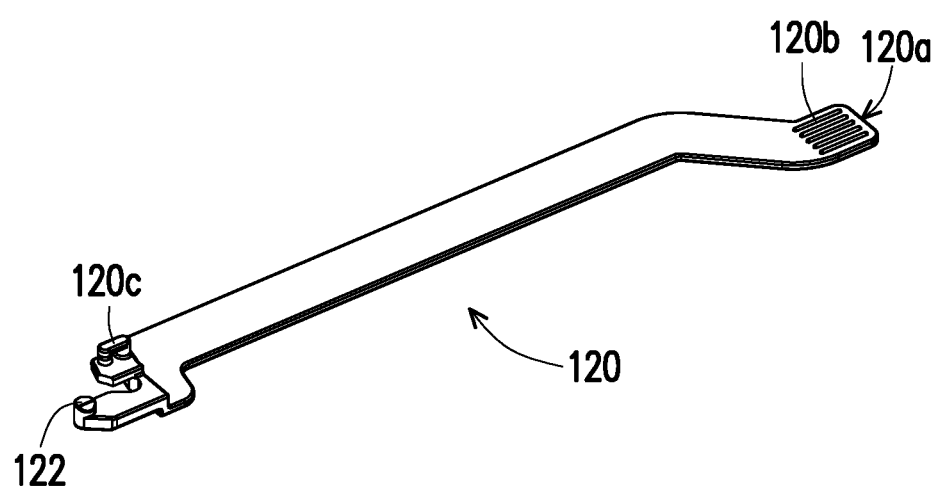
FIG. 10 is a perspective view of the operation shaft of FIG. 1.

Structure of the operation shaft 120 of the present embodiment is described in details as follows. FIG. 10 is a perspective view of the operation shaft of FIG. 1. With reference to FIG. 10, the operation shaft 120 of the present embodiment has a repousse 120b at the end portion 120a for increasing frictional force when the user is in contact with the operation shaft 120 for operation. In addition, the operation shaft 120 has a hooking part 120c to be hooked by one end of the elastic component 130 (as illustrated by FIG. 4A), whereas another end of the elastic component 130 is hooked to a hooking part 110b of the base 110 (as illustrated in FIG. 4A).

Figure 11:
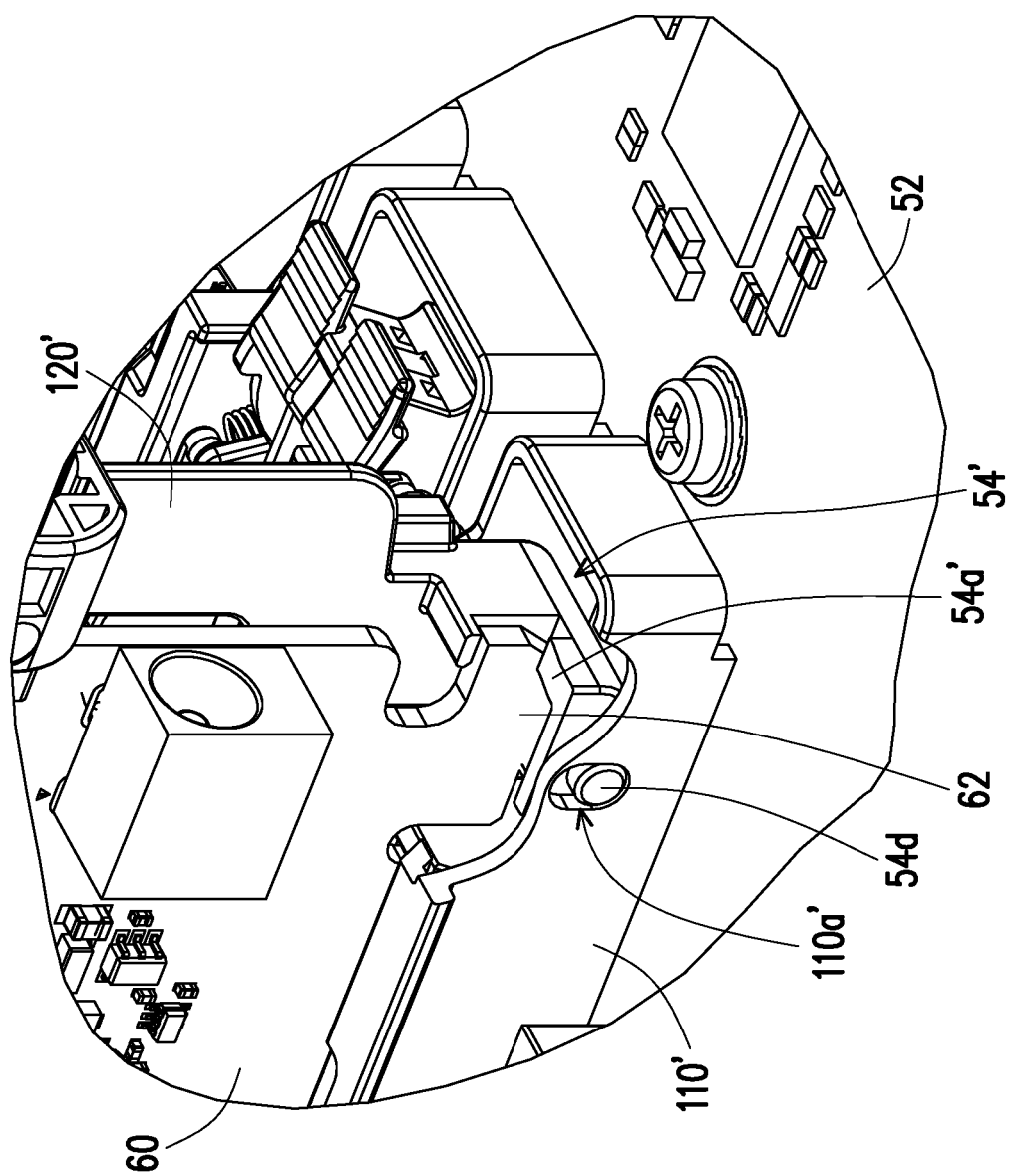
FIG. 11 is a partial perspective view of an electronic device according to another embodiment of the invention.
Figure 12:
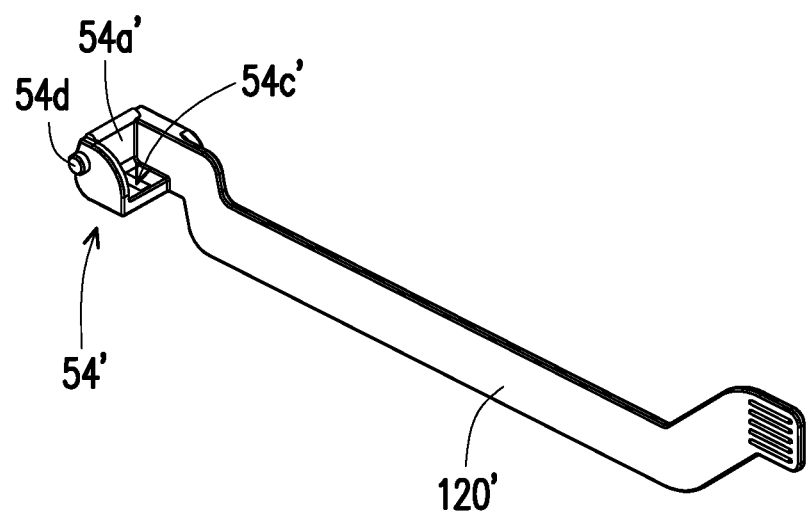
FIG. 12 is a perspective view of the operation shaft and the locking component of FIG. 11.
Figure 13:
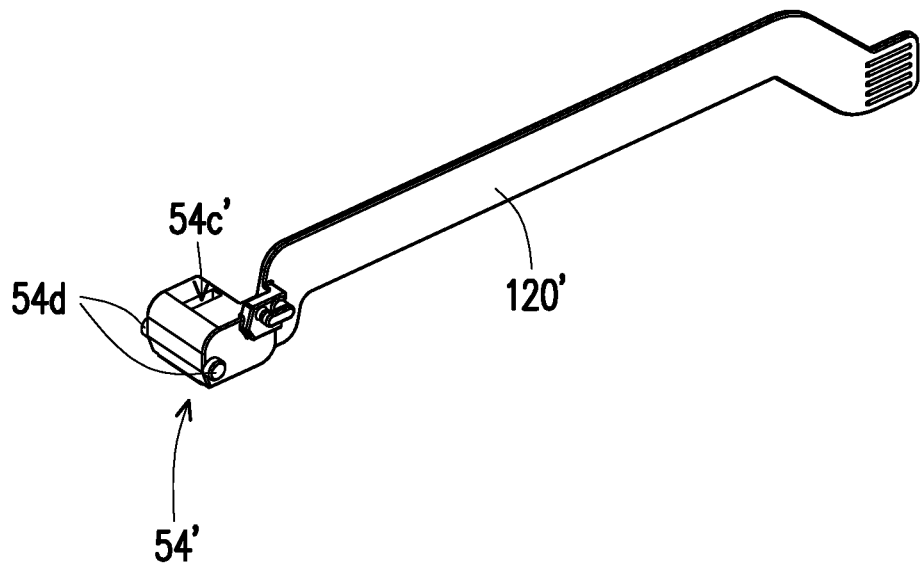
FIG. 13 is a perspective view of the operation shaft and the locking component of FIG. 11 from another angle.
Figure 14:
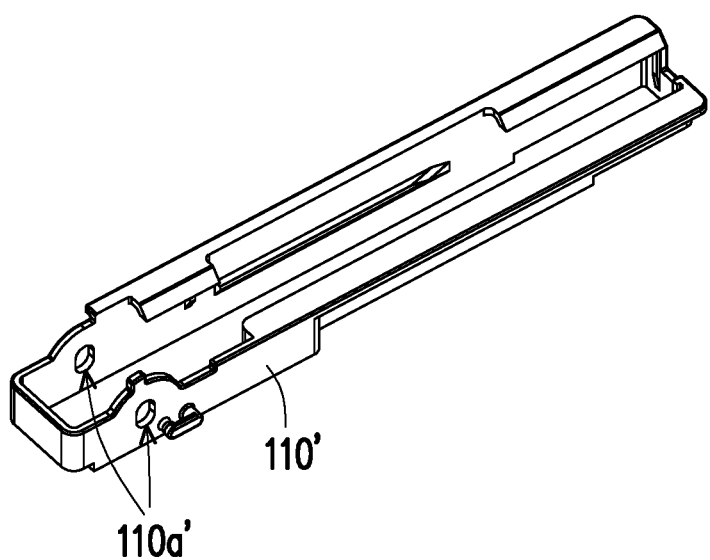
FIG. 14 is a perspective view of the base of FIG. 11.

The invention does not limit the form of the locking component, and an example of which is described as follows. FIG. 11 is a partial perspective view of an electronic device according to another embodiment of the invention. FIG. 12 is a perspective view of the operation shaft and the locking component of FIG. 11. FIG. 13 is a perspective view of the operation shaft and the locking component of FIG. 11 from another angle. FIG. 14 is a perspective view of the base of FIG. 11. The embodiment shown by FIG. 11 to FIG. 14 differs from the foregoing embodiments in that, a locking component 54' is included by the unlocking structure, and the locking component 54' is integrally formed and connected to an operation shaft 120' and adapted to rotate with the operation shaft 120'. In other words, compared the foregoing embodiments in which the locking component 54 and the operation shaft 120 are interlocked by pushing each other, the locking component 54' and the operation shaft 120' are integrally formed to be interlocked to each other.

A positioning slot 54c' of the locking component 54' of the present embodiment is similar to the positioning slot 54c of the locking component 54 of the foregoing embodiments, and configured to be inserted by the positioning part 52 of the object 60. A pushing part 54a' of the locking component 54' of the present embodiment is similar to the pushing part 54a of the locking component 54 of the foregoing embodiments, and configured to push up the object 60 for unlocking. Because the locking component 54' and the operation shaft 120' are interlocked as one, the locking component 54' does not have the pushing part 54a of the locking component 54 of the foregoing embodiments in which the pushing part 54a is used to push against the operation shaft 120. In addition, the operation shaft 120' and the locking component 54' of the present embodiment are pivoted to a pivot hole 110a' of a base 110' by a pivot shaft 54d on the locking component 54'. Detailed operations of the base 110', the operation shaft 120' and the locking component 54' of the present embodiment are similar to detailed operations of those of the foregoing embodiment, which are not repeated herein.

In summary, because the unlocking structure of the invention has the operation shaft, the user may apply force to the operation shaft to drive the locking component for unlocking without directly pressing the locking component. As a result, even if the locking component is shielded by the object inserted in the insert slot, the user can still smoothly detach the object.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An unlocking structure, adapted to an insert slot, an expansion card being adapted to be inserted into the insert slot and fixed on the insert slot by a locking component, the unlocking structure comprising:
    a base, adapted to be fixed on the insert slot; and
    an operation shaft, pivoted to the base, wherein the operation shaft is adapted to rotate in relative to the base from a locking position to an unlocking position to drive the locking component to be separated from the expansion card.

2. The unlocking structure according to claim 1, wherein the expansion card has a bottom portion and a top portion opposite to each other and is adapted to be inserted into the insert slot by the bottom portion, and an end portion of the operation shaft protrudes over the top portion of the expansion card when the operation shaft is located at the locking position or the unlocking position.

3. The unlocking structure according to claim 2, wherein the operation shaft is located at the locking position when an angle of the operation shaft relative to the base is a first angle, and the operation shaft is located at the unlocking position when the angle of the operation shaft relative to the base is a second angle greater than the first angle.

4. The unlocking structure according to claim 1, wherein the locking component is movably disposed in the insert slot and the operation shaft is adapted to push the locking component such that the locking component rotates in relative to the insert slot.

5. The unlocking structure according to claim 1, wherein the locking component is connected to the operation shaft and adapted to rotate with the operation shaft.

6. The unlocking structure according to claim 1, wherein the operation shaft has a pressing part, and the operation shaft is adapted to press the locking component by the pressing part to push the expansion card by the locking component such that the expansion card is separated from the insert slot.

7. The unlocking structure according to claim 1, wherein the operation shaft is adapted to rotate in relative to the base to a folded position to be close to the base.

8. The unlocking structure according to claim 1, comprising an elastic component, wherein the elastic component is connected between the base and the operation shaft, and the operation shaft is adapted to be positioned at the locking position or the unlocking position by an elastic force of the elastic component.

9. The unlocking structure according to claim 8, wherein the base has a first stopper, and the first stopper is adapted to resist the elastic force of the elastic component and stop the operation shaft at the locking position.

10. The unlocking structure according to claim 9, wherein the base has a pivot hole, the operation shaft has a pivot shaft, the pivot shaft is pivoted to the pivot hole, a length of the pivot hole in a moving direction is greater than an outside diameter of the pivot shaft, and the pivot shaft is adapted to move in relative to the base in the moving direction while the operation shaft rotates such that the operation shaft crosses over the first stopper.

11. The unlocking structure according to claim 9, wherein the first stopper is a bump extended from a side wall of the base and adjacent to the operation shaft located at the locking position.

12. The unlocking structure according to claim 1, wherein the base has a second stopper, and the operation shaft is adapted to be stopped by the second stopper at the unlocking position, the second stopper is a top surface of a side wall of the base and adjacent to the operation shaft located at the unlocking position.

13. The unlocking structure according to claim 1, wherein the base has a flange, and the flange engages with the insert slot.

14. The unlocking structure according to claim 1, wherein at least one side wall of the base and the insert slot stop each other.

15. An electronic device, an expansion card being adapted to be inserted into the electronic device, the electronic device comprising:
 a main body, having at least one insert slot, wherein the expansion card is adapted to be inserted into the insert slot;
 a locking component, the expansion card being adapted to be fixed on the insert slot by the locking component; and
 an unlocking structure, comprising:
  a base, fixed on the insert slot; and
  an operation shaft, pivoted to the base, wherein the operation shaft is adapted to rotate in relative to the base from a locking position to an unlocking position to drive the locking component to be separated from the expansion card.

16. The electronic device according to claim 15, wherein the expansion card has a bottom portion and a top portion opposite to each other and is adapted to be inserted into the insert slot by the bottom portion, and an end portion of the operation shaft protrudes over the top portion of the expansion card when the operation shaft is located at the locking position or the unlocking position.

17. The electronic device according to claim 15, wherein the operation shaft is located at the locking position when an angle of the operation shaft relative to the base is a first angle, and the operation shaft is located at the unlocking position when the angle of the operation shaft relative to the base is a second angle greater than the first angle.

18. The electronic device according to claim 15, wherein the unlocking structure comprises an elastic component, the elastic component is connected between the base and the operation shaft, the operation shaft is adapted to be positioned at the locking position or the unlocking position by an elastic force of the elastic component, the base has a first stopper, and the first stopper is adapted to resist the elastic force of the elastic component and stop the operation shaft at the locking position.

19. An electronic module, an expansion card being adapted to be inserted into the electronic module, the electronic module comprising:
 a motherboard, having at least one insert slot, wherein the expansion card is adapted to be inserted into the insert slot;
 a locking component, the expansion card being adapted to be fixed on the insert slot by the locking component; and
 an unlocking structure, comprising:
  a base, fixed on the insert slot; and
  an operation shaft, pivoted to the base, wherein the operation shaft is adapted to rotate in relative to the base from a locking position to an unlocking position to drive the locking component to be separated from the expansion card.

20. The electronic module according to claim 19, wherein the expansion card has a bottom portion and a top portion opposite to each other and is adapted to be inserted into the insert slot by the bottom portion, and an end portion of the operation shaft protrudes over the top portion of the expansion card when the operation shaft is located at the locking position or the unlocking position.

* * * * *